United States Patent [19]

Kinney

[11] 4,262,084

[45] Apr. 14, 1981

[54] PROCESS FOR PREPARING A SCREEN STENCIL

[75] Inventor: Layton C. Kinney, Chicago, Ill.

[73] Assignee: Imaging Sciences, Chicago, Ill.

[21] Appl. No.: 53,994

[22] Filed: Jul. 2, 1979

[51] Int. Cl.³ .............................................. B05D 3/06
[52] U.S. Cl. .................................. 430/308; 427/53.1; 427/273; 427/278; 427/288
[58] Field of Search ..................... 427/53.1, 54.1, 272, 427/273, 143, 278, 288; 430/308

[56] References Cited

U.S. PATENT DOCUMENTS

| | | | |
|---|---|---|---|
| 2,969,732 | 1/1961 | Kendall | 430/308 |
| 3,507,652 | 4/1970 | Wrench | 430/308 |
| 3,510,303 | 5/1970 | Preddy et al. | 430/308 |
| 3,573,975 | 4/1971 | Dhaka et al. | 427/54.1 |
| 3,676,128 | 7/1972 | Leopold et al. | 430/308 |
| 3,891,441 | 6/1975 | Tsuji et al. | 430/308 |

FOREIGN PATENT DOCUMENTS 2812846 9/1978 Fed. Rep. of Germany .

*Primary Examiner*—John H. Newsome
*Attorney, Agent, or Firm*—Joan I. Norek

[57] ABSTRACT

The invention provides on improved process for preparing a screen stencil, and a screen stencil prepared by the process. The process includes the steps of placing a porous support for a screen stencil over a mounting plate, saturating the porous support with a substantially carrier-free radiation curable composition. A backing plate is placed over the saturated porous support and rolling pressure is applied to the backing plate while allowing any excess composition to flow out from between the mounting plate and backing plate. The composition is then exposed to radiation through a positive disposed opposite the backing plate, and thereafter, uncured composition is removed from the porous support.

16 Claims, 4 Drawing Figures

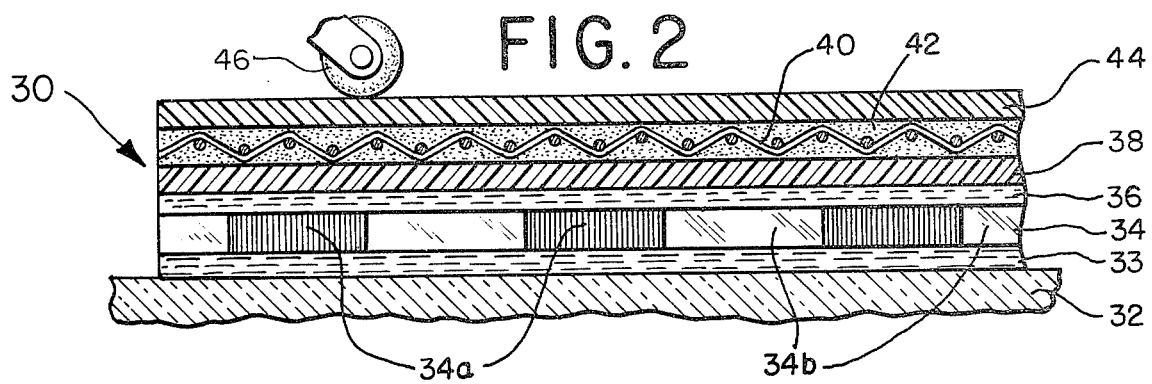
FIG. 2
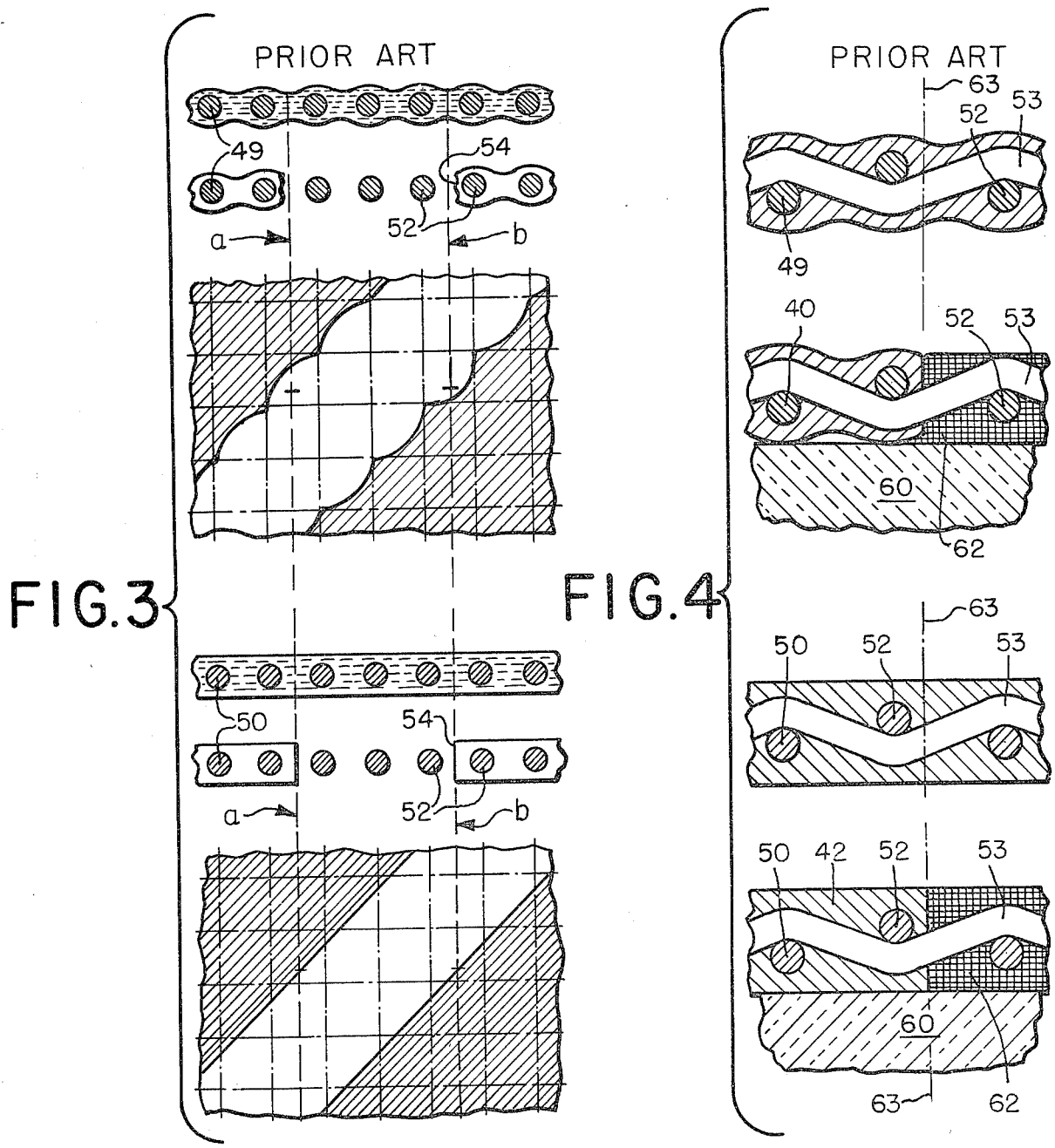
FIG. 3 PRIOR ART
FIG. 4 PRIOR ART

PROCESS FOR PREPARING A SCREEN STENCIL

TECHNICAL FIELD

The present invention provides an improved process for preparing a screen stencil for printing, and screen stencils prepared by the improved process. Screen stencils can be considered imaging or printing negatives, formed by blocking selected areas of a suitable porous support to the passage of ink or other imaging materials.

Screen stencils are commonly formed on porous supports such as fabrics (nylon, silk, or the like), or metal meshes held taut by a peripheral frame. The imaging materials normally used with this type of screen stencil are inks, liquid dyes or the like. Screen stencils, as used herein, also include stencils formed on other types of porous supports, such as the perforated metal sheets used in electrostatic printing. In electrostatic printing, the imaging material that selectively passes through the screen stencil is an electrostatic powder. The process of this invention includes forming these and other screen stencils by selectively blocking a porous support.

BACKGROUND OF THE INVENTION

Screen stencils are generally formed by first coating the porous support with a radiation, or light sensitive, composition, then protecting the image areas with a positive, and subsequently exposing the screen to sufficient light to cure the nonimage (unprotected) areas. The screen is then washed to remove the uncured composition, leaving unblocked image areas. The cured, nonimage areas remain coated, and can be considered blocked areas. The blocked and unblocked areas together form a printing stencil.

The most common method of preparing a screen stencil, the conventional direct process, requires coating the porous support, such as a framed fabric, with a fluid composition, such as a solution, emulsion, dispersion, or the like, which contains the light-sensitive material. The carrier for such compositions is a liquid, such as water. The carrier is then removed by drying, leaving behind a coating of solid, light-sensitive, i.e., light-curable, material on the fabric. The coated fabric is then brought into intimate contact with a positive by sandwiching it and the positive between a glass support and a rubber sheet, in an airtight assembly, and drawing a vacuum. The intimacy of contact between positive and fabric necessary for good resolution upon printing, however, requires the use of a strenuous condition of reduced air pressure. Such conditions would, of course, be unsuitable for use with a light-curable material that is itself liquid at ambient room temperature, due to the evolution of dissolved or entrained gases, such as air, with resultant bubble formation.

This direct process is limited to the use of a light-curable material that can be rinsed away when dried but not cured, but is insensitive to the rinsing medium if cured after drying. The hydrocolloid materials in general use for this process, however, often remain sensitive to water rinsing, or moisture in the air, or the printing vehicle or ink solvent, after light-curing. Any sensitivity of the cured coating to its environment of use reduces the resolution in printing provided by the screen stencil, and often causes breakdown of the stencil.

Further, when a typical hydrocolloid material is initially coated onto a fabric, it is generally coated in excess, and the excess is scraped off, leaving uniformity of coating thickness to the skill of the stencil maker, or to chance. If less than excess amounts of material are applied to the fabric, areas of the fabric may be insufficiently coated, and durability as well as uniformity of thickness again cannot be assured. Lack of uniformity of coating adversely affects deposit resolution and can result in at least portions of the print being excessively thick.

Excessively thick coatings on screen stencils are objectionable, particularly if a stencil is to be used with ultra-violet curable inks. The thickness of the screen stencil determines, in part, the thickness of the ink deposit. Ultra-violet curable inks dry by curing, not by solvent evaporation, and an excessively thick ink deposit can be too opaque, blocking radiation from curing the ink through to the substrate.

High quality, fine detail screen printing is also generally recognized in the field as requiring that the edges of the nonimage areas (the break between nonimage and image areas) present smooth lines or curves, without serrations or "saw tooth" when viewed either vertically or horizontally. To achieve this, in part, the coating must be formed so as to present a planar surface to a substrate to be printed, and be uninfluenced by the cross points of, and open spaces between, the fabric filaments. Generally, such a planar surface cannot be formed when using conventional direct process coating materials wherein the light-curable coating is dried, by evaporation, from a liquid vehicle that may comprise about two-thirds of the coating material, because substantial shrinkage ensues. The coating tends to align itself within the openings, coating the filament cross points at a higher plane. Multiple coatings generally do not substantially alleviate this lack of planar surface of the coating.

Another conventional, but less commonly used, method of preparing a screen stencil utilizes a solid film of light-curable hydrocolloid that is exposed to light through a positive before it is applied to the porous support (stencil blank). The hydrocolloid film is supported on a transparent support sheet during exposure, and during the subsequent washing to remove uncured portions. The washing wets and softens the cured portions, and thereby allows the cured portions to become attached to a stencil blank when pressed down over the remaining areas of the hydrocolloid film. It is generally recognized that the hydrocolloid film is only partially cured on the side facing away from the light source, and this partial curing may enhance the attachment of the hydrocolloid film to the stencil blank. When the exposed and washed hydrocolloid film dries, the support sheet is removed, leaving it secured to the stencil blank.

This process provides a reasonably planar surface to present to a substrate to be printed. Some of the partially cured material opposite this planar surface is generally washed away, reducing coating thickness. The reduced coating thickness, together with the largely mechanical bond between coating and stencil blank, tend to make screen stencils produced by this process very fragile. Multifilament fabrics must be used to achieve even modest durability. These screen stencils, having been prepared with hydrocolloid materials, are also moisture and solvent sensitive.

In a "direct-indirect" process, a preformed, unsensitized, hydrocolloid film is transferred to a stencil blank, and treated to sensitize it and secure attachment to the stencil blank. It is thereafter subjected to the exposure and washing steps of the direct process. This process does not ensure the formation of a planar surface; the hydrocolloid film tends to sink into the openings between filaments.

The use of a light-curable material that is itself liquid at ambient room temperature is known in the art, for example the process and materials disclosed in the British Pat. No. 618,181. Therein is described impregnating and/or coating the screen material with a carrier-free photosensitive material, superimposing a positive (referred to therein as negative) on the screen, and exposing through the positive to light. No provision is made for ensuring intimate contact between either positive and/or the positive, fabric, and any intermediary film, or uniformity of coating thickness, or complete encapsulation of fabric filaments, all deemed necessary for the printing resolution demanded by the field today.

DISCLOSURE OF THE INVENTION

The present invention provides a screen stencil affording high resolution in printing and having a high stencil life by preparing the stencil with a carrier-free, fluid light-sensitive composition in a manner that assures intimate contact between positive and screen, uniformity of coating thickness, and complete encapsulation of fabric filaments, to achieve a screen stencil that provides a planar surface to be presented to the substrate to be printed.

The process includes the steps of saturating the fabric, or more broadly the porous support, with the carrier-free, liquid composition while the fabric overlies the positive. The positive would most commonly be supported by a plate from below at this time, although self-supporting positives could be used. A flexible backing plate is then positioned over the fabric, and rolling pressure is applied to the backing plate from above, from the center of the backing plate outward to its edges. The rolling is continued until all excess composition is squeezed out at the edges. The point at which the light-curable composition film below the backing plate is not only uniform, but also provides an encapsulating coating forming upper and lower planar surfaces, cannot be passed by normal rolling forces; the thickness of the fabric determines the thickness of the film. Moreover, the fact that the fabric and positive are separated only by a thin liquid film, or films, and a thin plate in some embodiments, assures the intimate contact necessary for maximum resolution.

Since the composition applied is substantially totally curable, the coating solidifies only upon curing, and no detectable shrinking occurs. (Any shrinking upon curing is clearly not of the order attendant upon drying a hydrocolloid film from a solution or suspension.) The thickness and uniformity of the coating after rolling is determined by the thickness of the fabric, and is retained throughout the cure cycle. The use of a liquid, light-curable material further provides a stencil screen that, after cure, retains only a liquid coating on the image (non-blocked) areas. Such liquid, uncured material is far easier to remove than a dried, but uncured, coating, and reduces the risk of eroding the cured areas of the stencil upon rinsing. Moreover, the present process allows the use of alternate liquid light-curable materials that are not suitable for the coat-dry-vacuum process described above, and yet is simpler and provides more consistent and higher quality screen stencils, without the use of a costly vacuum system.

These and other advantages will become more apparent from the detailed description of the preferred embodiments below.

BRIEF DESCRIPTION OF THE DRAWINGS

FIG. 2 is a diagrammatic, elevated side-view of an assembly for use in the process of FIG. 1;

FIG. 3 is a diagrammatic comparison of a direct process and present process fabric, before cure in a cut-away side view, and after cure and rinsing in a cut-away side view and plan view;

FIG. 4 is a diagrammatic comparison of a direct process and present process fabric, in cross-section with intersection filaments.

PREFERRED EMBODIMENTS OF THE INVENTION

Figure 1:
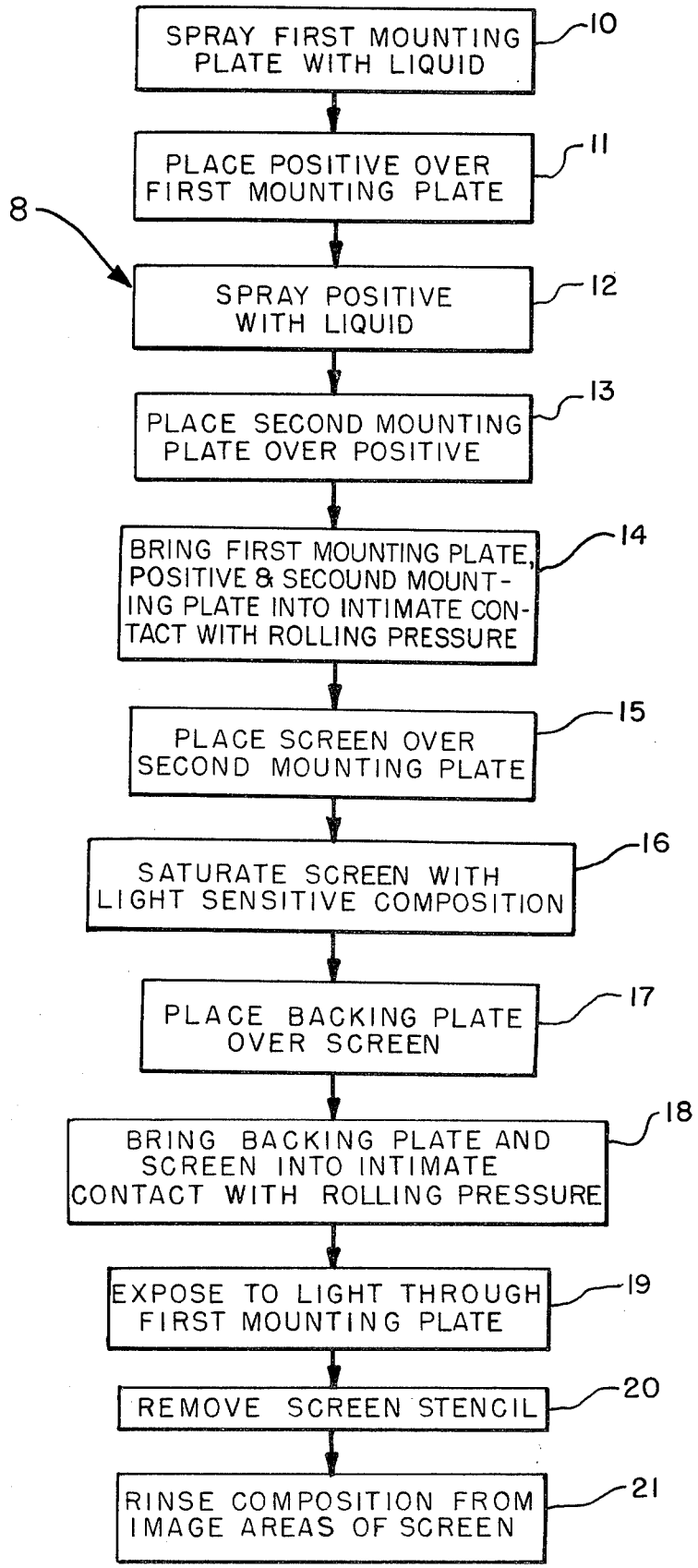
FIG. 1 is a flow diagram of a process embodying features of the present invention.

The advantageous simplicity of the process can be illustrated by a description of the mechanics of the process. Referring first to FIGS. 1 and 2, there is illustrated, respectively, a process, designated generally by the reference numeral 8, embodying features of the invention, and an assembly, designated generally by the reference numeral 30, that can be used in process 8.

The assembly 30 includes, briefly, a first mounting plate 32, a film of mineral spirits 33, a positive 34, having blocked, image areas 34a, and unblocked, nonimage areas 34b, a film of mineral spirits 36, a second mounting plate 38, a porous support or screen fabric 40, a substantially carrier-free light-curable composition 42, a backing plate 44, and a means for applying rolling pressure or roller 46. Also briefly, the first mounting plate 32 is a transparent glass support for the overlying positive 34. The positive 34 is a thin film of opaque and transparent areas as is conventionally used in the screen stencil field. The second mounting plate 38 is a thin flexible polyester film, such as Mylar. The screen fabric 40 is a conventional framed polyester fabric. The light-curable composition 42 is a mixture of polyethylenically unsaturated compounds, including monomeric compounds such as styrene, acrylic acid, methacrylic acid, or esters thereof, and about 0.01 to 5% by weight of a suitable photosensitizer. The backing plate 44 is a thin, flexible film of an amber polyester, which in addition to its other functions is an antihalation film.

The process 8 includes the steps of (10) spraying the first mounting plate 32 with mineral spirits 33, (11) placing the positive 34 over the first mounting plate 32, (12) spraying the positive 34 with mineral spirits 36, (13) placing the second mounting plate 38 over the positive 34 and mineral spirits 36, and (14) applying rolling pressure with the roller 46 to form thin, substantially continuous films of mineral spirits 33, 36 between respectively the first mounting plate 32 and positive 34, and between the positive 34 and second mounting plate 38, and, through the vacuum formed by the displacement of air and the cohesive forces of the films of mineral spirits 33, 36, to maintain them in intimate contact. The next steps include (15) placing the screen fabric 40 over the second mounting plate 40, and (16) saturating the fabric 40 with the light-curable composition 16. This can be accomplished by pouring the light-curable composition 42 on the second mounting plate 38 before placing the fabric 40 into position, and thereby allowing the composition 42 to rise through the fabric 40 when in place. The subsequent steps prior to light exposure are (17) to place the backing plate 44 over the saturated fabric 40, and (18) to apply rolling pressure to bring the backing plate 44, fabric 40, and second mounting plate 38 into intimate contact, again relying on the vacuum thus produced and the cohesive forces of a liquid film, here the composition 42. The assembly 30 is then exposed to light, step (19), through the first mounting plate 32 to the saturated fabric 40. After sufficient light exposure to convert those portions of the composition 42 not blocked by the positive 34 to a solid coating, (20) the fabric 40, which can now be considered a screen stencil, is removed from the assembly 30, and (21) rinsed to remove the uncured, and still liquid, composition.

The process 10, which allows the use of the substantially carrier-free, light-curable composition 42, nonetheless allows intimate contact to be achieved between the positive 34 and the screen fabric 40, here through the film of mineral spirits 36 and second mounting plate 38. The process 10 not only allows coating materials that are liquid at the ambient room temperature to be used in the process and those materials that are soluble in their co-components, but also allows the use of air, or oxygen-inhibited materials. The light-curing is commonly a radiation-induced polymerization, and many free-radical reactive monomers are deactivated or inhibited by oxygen. The composition 42 in process 10 is sandwiched between the second mounting plate 38 and the backing plate 44, and is thus protected from further access to, or diffusion of, atmospheric oxygen. As will be discussed further below, the backing plate 44 is preferably sufficiently transparent, and the stencil maker can determine visually the point at which all air bubbles and excess compound have been removed.

Further, the intimate contact achieved through the use of liquid films between all solid plates between the positive 34 and saturated fabric 40 is at least comparable, and is believed superior, to that achieved by vacuum drawing wherein contact is attempted between a shrunken, dried film and a flat surface. The use of alternating liquid films and flat solid plates, rolled together, assures a continuum without air pockets, which air pockets of course have adverse effects on print quality. A coplanar relationship between the positive 34 and the adjacent surface of the lightcurable composition 42 is desired and achieved by the present process. The presence of a film of mineral spirits 33 between the positive 34 and the first mounting plate 32 avoids the presence of air bubbles below the positive 34 that would disturb this coplanar relationship.

The uniformity of coating thickness, achieved by rolling the excess of composition 42 from between the backing plate 44 and second mounting plate 38, is believed unattainable from conventional processes, and results in superior printing quality. The rolling leads to a point at which the composition 42 fills all spaces between filaments of the fabric 40 and is present as a uniform film between the filaments and adjacent plates. Once this point is reached, further rolling has no effect. It is well within the skill of one with ordinary skill in the art to determine the extent of rolling necessary to reach this point. When a sufficiently transparent, flexible backing plate 44 is used, ridges of excess composition 42 can be seen to form below when rolling is stopped prior to this point, advising the stencil maker that the rolling should be continued. This is particularly seen if the composition 42 also contains a dye. Encapsulation of the fabric filaments 40 is also assured by the thickness of the composition 42 layer at this point.

Referring now also to FIG. 3, there is illustrated a comparison of a direct process fabric 49 and a present process fabric 50, first before cure in a cutaway side view, after cure and rinse in a cutaway side view, and plan view. The noncured image area is between lines a and b. After cure, the spaces between filaments 52 along the breaks 54 from image to nonimage areas tend to be left open in the direct process because the cured portion is possibly washed or shrunken away from the original line of exposure, resulting in a saw tooth effect in the horizontal plane. The cause of this effect is not certain. This effect is difficult to avoid in any process where the coating follows the contours of the fabric mesh. The line between print and non-printing in use will likewise be saw-toothed rather than straight. In the present process 8, a film of composition 42 is present both below and above each filament 52 of the fabric 40 forming planar surfaces, and these portions when cured allow the cured portion of the space to span the space to the point of the break 54. In plan view, no saw tooth can be seen.

The phenomenon depicted in FIG. 3 had been found to exist, but the explanation thereof is only speculative. Transition between cured and noncured areas in hydrocolloid type coatings may be less abrupt, or the hydrocolloid coating may be eroded because it is softened by the developer (warm water). This phenomenon nonetheless has been observed, and the present invention is not limited to any theory thereon.

Referring now to FIG. 4, there is illustrated a another comparison of the effect of a planar stencil surface in eliminating saw-tooth. Both fabrics 49 and 50 are shown in cross-section with intersecting filaments 52, 53, in contact with a substrate 60 being printed with ink 62. When the composition 42 is cured to a uniform, planar film, it lays flat against the substrate 60, and blocks the ink 62 from flowing past the break 63 between image and nonimage areas. The non-planar coated fabric 49, however, even when the coated filaments 52, 53 of the fabric lie flush against the substrate 60, allow ink to flow below the cured coating, resulting in poor resolution. The nonplanar surface may be a significant cause of saw-tooth. Attempts to avoid non-encapsulation or nonplanar coatings upon shrinking by using an excess of coating material result in irregular bulges of coating beyond the filaments 52, 53, causing portions of the fabric 49 to be positioned apart from the substrate being printed. This also leads to poor resolution, and excessive deposit thickness.

The first mounting plate 32 must be transparent to that portion of radiation that will cure the composition, and should be sufficiently thick to provide support to the assembly 30 and to withstand rolling pressure. A flat sheet of glass of about ¼ to about ⅜ inch thickness has been found to be satisfactory.

Mineral spirits is preferably used as the liquid in films 33 and 36 between the first mounting plate 32 and positive 34, and the positive 34 and second mounting plate 38, being available in sufficient clarity, and being within a suitable range as to viscosity, rates of evaporation, and surface tension, but the selection of other suitable liquids is well within the skill of one of ordinary skill in the art.

The second mounting plate 38 is preferably a thin sheet of polyester, such as polyethylene terephthalate and is preferably uniformly from about 0.0005 inches to about 0.002 inches in thickness. A flexible second mounting plate 38 provides ease in forming a continuous liquid film below. The thickness chosen is a compromise between avoiding excess thickness and the attendant paralax effect between positive 34 and fabric 40, and avoiding impractically thin films that may have pinholes which remain undetected until used in an attempt to prepare a stencil.

As mentioned above, the porous support 30 can be a mounted or framed fabric, a metal mesh, a perforated metal sheet or the like. If framed, the dimensions of the backing plate 44 must be smaller than the frame.

The following are Examples of some embodiments of the invention.

EXAMPLE I

A 390 mesh polyester fabric (orange) was stretched on a frame to form a printing screen blank. A positive transparency of a Ulano[1] step wedge exposure chart was used to form the completed stencil in the following manner: The positive transparency was placed emulsion side up on a ¼ inch plate glass support and adhered to the glass with a film of mineral spirits. This in turn was covered by a 1 mil film of photographic grade Mylar which was also adhered by a film of mineral spirits. Excess liquid and any air bubbles were expelled by rolling to the periphery with a brayer. The frame with the attached screen fabric was placed print side (the side that is in contact with the print in use) down and a compound of the composition shown below was poured onto the ink side (the side to which ink is applied in use). This was covered by a 3 mil amber Mylar[2] back-up sheet. Excess compound was then rolled out of the image area with a brayer until no more could be expelled from the sandwich. The assembly was then exposed image-wise through the glass to a 400 W. mercury arc lamp at a distance of 36". Five successive step-wise exposures were made to determine optimum exposure timing. After exposure the sandwich was disassembled and uncured compound was removed by washing out with ethyl acetate. After drying, screen prints were made from the stencil, four point type and larger were reproduced with excellent sharpness in the positive image area at the optimum exposure time range of 11 to 19 minutes edges of letters and lines were free from the "saw tooth" effect often found in conventionally produced screen prints.

1—Ulano 210 E 86th Street New York 10028
2—Amber Mylar sold under various trade names Joanna Western Mills Chicago 60616

The composition of the screen stencil-forming compound was as follows:

|  | Part/Wt. |
|---|---|
| Roskydal E 70[3] | 100 |
| Benzoin Isobutyl Ether[4] | 4 |
| Crystal Violet | .075 |
| Extra Pure APN[5] |  |

3—Mobay Chemical Corp. Pittsburgh, Pa. 15205
4—Stauffer Chemical Co. Westport Ct. 06880
5—E I Dupont De Nemours & Co. (Inc.) Wilmington, Del. 19898 Chemicals Division

EXAMPLE II

The positive transparency of Example I was placed on a rigid flat surface which had been covered with a tightly stretched screen mesh secured to the surface at the edges. The transparency was placed emulsion side up and was secured to an overlying sheet of Mylar as in Example I with mineral spirits. A screen stencil blank of the same material as in Example I was placed over the assembly print side down and the compound of Example I was poured onto the ink side of the screen and then covered with a sheet of 3 mil amber Mylar. The excess compound and any entrained air bubbles were removed from the image area by rolling with a brayer as in Example I. The assembly was then removed from the fabric-covered support plate and exposed imagewise directly through the positive to a 400 watt mercury arc lamp at a distance of 32" 5 step-wise exposures were made. After disassembling the sandwich the uncured compound was washed from the stencil with ethyl acetate and dried. A screen print from the resultant stencil revealed sharp images of 4 to 14 point type inclusive in positive image area in the optimum exposure range of 7 to 15 minutes. Edges of prints were free from "saw tooth".

EXAMPLE III

A support block higher than the depth of the screen frame and having a smooth-hard surface somewhat smaller than the inside dimensions of the frame was fitted with a slip sheet of plain paper of the same size as the block. This in turn was covered with an amber Mylar back-up sheet after which a screen stencil blank was placed over the assembly print side up. Upon this the compound of Example I was poured. Over this was placed a 1 mil Mylar cover sheet to which was secured the transparency of Example I with mineral spirits, the excess of both compound and mineral spirits along with entrained air were removed from the image area by rolling outward from the center with a brayer as in preceding examples. The assembly was then removed from the support block and exposed as in Example II. The screen stencil was then washed in ethyl acetate to remove uncured compound. Prints were made from the stencil which were of comparable quality and exposure range as those of Example II.

EXAMPLE IV

The procedure of Example II was repeated with the exception that the positive transparency and amber Mylar back up sheet were treated with a fluorocarbon release spray M.S. 122[6] and the 1 mil Mylar cover sheet was eliminated thus the sequence was as follows:

The positive transparency treated as described was placed emulsion side up on the fabric covered support plate of Examples II and III. A screen frame blank of the same type as previous examples was placed print side down on the positive. The compound of Example I was poured on the ink side and covered with the treated amber back-up sheet. Excess compound was removed from the image area as described in previous examples. The assembly was then exposed as in examples II and III. Prints from this stencil were comparable to those of the preceding examples. The procedure of this example is substantially more time consuming than Examples I–III due to the absence of the 1 mil Mylar cover sheet which prevents soiling of the adjacent surfaces by excess stencil compound this cover sheet is normally disposed of without cleaning.

6—Miller Stephenson Chemicals Co. Inc. Danbury Ct. 06810

In Examples II and IV, the purpose of the fabric covering of the support surface is to prevent adherence of the positive to the support surface in the event minor quantities of mineral spirits (Example II) or compound (Example IV) seep under the positive. This fabric could as well be stretched on a frame larger than the screen that is removably placed on the support surface.

Example III the paper slip sheet serves the same purpose it is furthermore immaterial whether it adheres to the sandwich since it is behind the imaged area and thus does not interefere with the exposure.

INDUSTRIAL APPLICATION

The screen stencils prepared by the process of the present invention are used commercially for printing labels on containers such as plastic or glass bottles, for the preparation of printed circuits, and placing decorative images on glass, mirrors, textiles, plastic articles and the like.

I claim:

1. A process for preparing a screen stencil that provides high resolution printing, comprising:
   placing a porous support for a screen stencil over a mounting plate;
   saturating said porous support with a substantially carrier-free composition consisting essentially of liquid radiation-curable materials and from 0.01 to about 5% by weight of a photo-sensitizer;
   placing a backing plate over said saturated porous support;
   applying rolling pressure to said backing plate to force excess of said substantially carrier-free radiation curable composition to flow out from said mounting plate and said backing plate;
   exposing said composition to sufficient radiation through a positive opposite said backing place to cure exposed portions of said composition; and
   removing uncured composition from said porous support by rinsing with a liquid.

2. The process of claim 1 wherein said backing plate is flexible.

3. The process of claim 2 wherein said flexible backing plate is an antihalation film formed of amber polyester.

4. The process of claim 2 wherein said porous support is first placed over said mounting plate, and thereafter said substantially carrier-free material is applied to said porous support to saturate said porous support.

5. The process of claim 2 wherein said substantially carrier-free material is applied to said mounting plate prior to placing said porous support on said mounting plate.

6. The process of claim 2 wherein said backing plate is transparent.

7. The process of claim 1 further including:
   placing a positive over a first mounting plate;
   placing a second mounting plate over said positive; and
   placing said porous support over said second mounting plate.

8. The process of claim 7 further including:
   spraying said positive with a liquid prior to placing said second mounting plate over said positive; and
   applying rolling pressure to said second mounting plate to bring said positive and said second mounting plate into substantially intimate contact.

9. The process of claim 1 wherein said liquid radiation curable materials of said substantially carrier-free composition is a mixture of polyethylenically unsaturated compounds.

10. The process of claim 9 wherein said substantially carrier-free composition further includes a sufficient amount of dye to color said composition.

11. A screen stencil prepared by the process of claim 1.

12. A process for preparing a screen stencil whereby an oxygen-inhibited radiation curable composition is protected from oxygen diffusion thereto during exposure to radiation, comprising:
   saturating a screen stencil blank with a substantially carrier-free composition consisting essentially of liquid, radiation-curable materials and from 0.01 to about 5% by weight of a photo-sensitizer;
   sandwiching said saturated screen stencil blank between two flat plates;
   removing air from between said two flat plates;
   exposing a portion of said saturated screen stencil blank to radiation to cure exposed portions of said composition thereby forming a screen stencil; and
   removing uncured composition from said screen stencil by rinsing with a liquid.

13. The process of claim 9 wherein the uncured composition is removed by rinsing with ethyl acetate.

14. A process for preparing a screen stencil that provides high resolution printing, comprising:
   supporting a screen stencil blank with a rigid mounting plate;
   saturating said screen stencil blank with an excess of composition consisting essentially of radiation-curable material that is liquid at ambient room temperature and from about 0.01 to about 5% by weight of a photosensitizer;
   placing a flexible backing plate over said screen stencil blank and excess composition;
   applying rolling pressure across said backing plate to remove excess composition by squeezing out from between said mounting plate and said backing plate until further rolling pressure has substantially no effect as to removing composition;
   exposing said composition and screen stencil blank to radiation through a positive, while maintaining the assembly of mounting plate, saturated screen stencil blank, and backing plate, so as to form a screen stencil; and
   rinsing with a liquid to remove uncured composition.

15. The process of claim 14 wherein said radiation-curable material is a mixture of polyethylenically unsaturated compounds.

16. The process of claim 15 wherein the rinse liquid is ethyl acetate.

* * * * *